United States Patent [19]

Cannella et al.

[11] Patent Number: 4,746,989

[45] Date of Patent: * May 24, 1988

[54] CONTACT-TYPE IMAGER FOR SCANNING MOVING IMAGE-BEARING MEMBERS

[75] Inventors: Vincent D. Cannella, Birmingham; Zvi Yaniv, Farmington Hills; Robert R. Johnson, Farnklin, all of Mich.

[73] Assignee: Energy Conversion Devices, Inc., Troy, Mich.

[*] Notice: The portion of the term of this patent subsequent to Sep. 1, 2004 has been disclaimed.

[21] Appl. No.: 924,729

[22] Filed: Oct. 30, 1986

Related U.S. Application Data

[63] Continuation-in-part of Ser. No. 912,477, Sep. 29, 1986, Pat. No. 4,691,244.

[51] Int. Cl.⁴ ............................................. H04N 1/024
[52] U.S. Cl. ................................. 358/294; 358/213.11; 357/30
[58] Field of Search ..................... 358/213.11, 213.13, 358/213.29, 213.31, 212, 294; 357/24 LR, 30 H, 30 L, 30 G

[56] References Cited

U.S. PATENT DOCUMENTS

| 3,603,731 | 9/1971 | Weimer | 358/213.29 |
|---|---|---|---|
| 3,696,250 | 10/1972 | Weimer | 358/213.22 |
| 4,149,197 | 4/1979 | Kos et al. | 358/294 |
| 4,217,611 | 8/1980 | Ogawa | 358/294 |
| 4,482,804 | 11/1984 | Oritsuki et al. | 358/213.11 |
| 4,691,243 | 9/1987 | Cannella et al. | 358/213.11 |
| 4,691,244 | 9/1987 | Cannella et al. | 358/213.11 |

Primary Examiner—Jin F. Ng
Assistant Examiner—Stephen Brinich
Attorney, Agent, or Firm—Marvin S. Siskind; Richard M. Goldman

[57] ABSTRACT

Apparatus for scanning the image on an image-bearing member moved past an array of thin film light sensitive elements, said apparatus relying upon the concept of "proximity focusing" in order to generate electrical signals for replicating said image.

32 Claims, 5 Drawing Sheets

CONTACT-TYPE IMAGER FOR SCANNING MOVING IMAGE-BEARING MEMBERS

Related Applications

This application is a continuation-in-part application of copending U.S. patent application Ser. No. 912,477, now U.S. Pat. No. 4,691,244, filed Sept. 29, 1986.

FIELD OF THE INVENTION

The present invention generally relates to apparatus adapted to generate electrical signals representative of an image on an image-bearing member. The present invention more particularly relates to apparatus including an array of light sensitive elements adapted to generate electrical signals representative of an image on an image-bearing member such as a printed document wherein the image is detectable by sensing light from the high and low optical density portions thereof. In its most specific form, the instant invention relates to a contact imager in which the electrical signals are generated as the image-bearing member moves past the array of light sensitive elements so as to have light emanating from small area portions of the image-bearing surface thereof "proximity focused" onto associated ones of said elements.

BACKGROUND OF THE INVENTION

Systems for converting an image, such as the characters of an image-bearing document, into electrical signals which can either be stored in a memory for later recall or which can be transmitted to a remote location over, for example, telephone communication or similar systems, are well known in the image reproduction art. Systems of this type have generally been referred to as line scanners. In one type of line scanner, the document is held stationary and a photodetector or an array of photodetectors are scanned across each line of the image-bearing document along with a localized light source. In another type of scanner, the array of photodetectors and light source are held stationary while the document is moved therepast. In both types of systems, as the image-bearing document is scanned, the high optical density or dark portions of the document reflect less light from the light source for reception by the photodetectors than the low optical density or light portions of the document. As a result, the high and low optical density portions of the image-bearing document can be contrasted by the photodetectors for generating electrical signals representative of the image on or other surface characteristic of that document.

While systems of the type described above have been generally successful in fulfilling their intended purposes and have found commercial acceptance, these systems have heretofore exhibited several deficiencies. For one thing, due to the relative motion which must exist between the document and the photodetectors, a large static electrical charge is built-up on the document being scanned. Therefore, precautions must be undertaken to prevent that static charge from inducing an electrical charge in the spacedly positioned array of photodetectors, which induced charge would be capable of deleteriously affecting and possibly fatally damaging said photodetectors. By utilizing the photodetector structure detailed in commonly assigned U.S. patent application Ser. No. 912,477, the problem associated with static charge induction has been obviated.

Another deficiency which is present in prior art contact line scanning systems arises due to the constant abrasive contact which the array of light sensitive elements incurs due to the movement of the image-bearing document therepast. Similarly, the array of light sensitive elements may be employed in an environment wherein acidic, corrosive or other deleterious gases could detrimentally affect the semiconductor alloy material from which those elements are fabricated and hence degrade the performance of the array. By depositing any of the transparent, hard protective coatings described in commonly assigned U.S. patent application Ser. No. 912,476 immediately atop said elements, the problems associated with such abrasive and corrosive environments have been substantially eliminated.

Since the previously encountered problems of static charge build-up and paper abrasion have been eliminated in a manner which protects the light sensitive elements of a contact imaging photosensor array, it now becomes commercially feasible to fabricate contact image scanners wherein relative motion exists between the image-bearing document and the array of light sensitive elements. It is therefore the major object of the present invention to provide a contact-type image scanning apparatus in which the image-bearing document is moved in a proximity focusing manner past the light sensitive elements of a photosensor array without detrimentally affecting said elements.

Other objects and advantages of the subject invention will become apparent from a perusal of the detailed description of the invention, the drawings and the claims which follow.

SUMMARY OF THE INVENTION

The subject invention provides an improved image scanning apparatus, said apparatus adapted to generate electrical signals representative of small area portions of an image projected onto an associated array of small area light sensitive elements. In accordance with one important embodiment, there is provided a contact-type page scanner which is adapted to electronically scan a document or other image-bearing member disposed in close proximity thereto.

The present invention therefore provides an apparatus adapted to generate electrical signals representative of an image on an image-bearing member, which apparatus includes an array of spaced apart, continuous, small area, light sensitive elements formed from deposited, thin film, semiconductor material operatively disposed and designed for receiving said image. Each of these small area elements is capable of effecting a detectable electrical characteristic responsive to the intensity of light received thereon from a corresponding small area portion of the image. The array includes at least one column of light sensitive elements operatively disposed so as to cover at least a portion of at least one dimension of the image-bearing member. A transparent cover layer overlies said light sensitive elements, which cover layer forms at least a part of a spacer which is operatively disposed for closely positioning the light sensitive elements in juxtaposed relation relative to said image-bearing member so as to proximity focus light onto said light sensitive elements from corresponding small area portions of said member. The cover layer is formed of an abrasion resistant material selected from the group consisting essentially of a silicon-carbon alloy, a silicon-nitrogen alloy, a silicon-oxygen alloy or a microcrystalline carbon alloy.

The semiconductor alloy material from which the light sensitive elements are fabricated is selected from the group consisting essentially of silicon, germanium or combinations thereof and may further have one or more density of states reducing elements, such as hydrogen or fluorine, added thereto. The light sensitive elements may be operatively utilized as p-i-n photovoltaic diodes or photoresistors.

Preferably, associated with each of the light sensitive elements is an isolation diode or field effect transistor for facilitating the selective addressing and detection or the electrical conductivity of each light sensitive element by the application of read potentials to respective pairs of address lines associated with each of said elements.

Also included as part of the instant invention is apparatus for projecting light onto the image-bearing member, said apparatus operatively disposed on the side of the image-bearing member closest to said cover layer. The light projected onto said member is preferably colored, such as by the sequential projection of red, green and blue light thereonto. The electrical signals provided by each light sensitive element can thereafter be correlated to derive the proper color hue of the small area portion of the image-bearing member adjacent each of the associated light sensitive elements.

Further, a static shielding layer may be interposed, as by vacuum deposition, between the light sensitive elements and the transparent cover layer to ensure that any static discharge from the image-bearing document cannot induce an electrical charge in the adjacent array of light sensitive elements.

In its most preferred embodiment, the image-bearing member is moved past the juxtaposed array of small area light sensitive elements so as to provide a relatively small, compact, lightweight contact-type of image scanning apparatus particularly adapted for downstream interconnection with related apparatus such as display apparatus, memory buffing apparatus or related data processing apparatus.

BRIEF DESCRIPTION OF THE DRAWINGS

FIG. 9 is a perspective view of contact document scanning apparatus of the type illustrated in FIGS. 1 and 8 and specifically depicting, in phantom outline, an image-bearing document moving past the photosensor array thereof;

DESCRIPTION OF THE PREFERRED EMBODIMENTS

Figure 1:
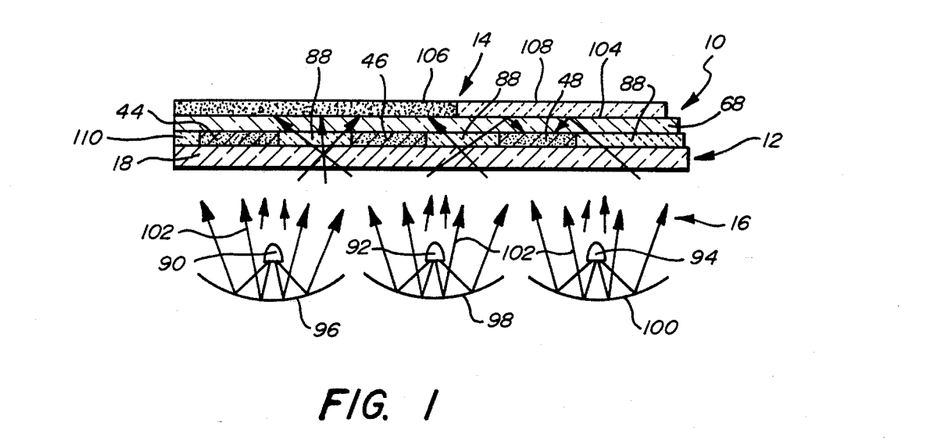
FIG. 1 is partial side view, partly in cross section, of the contact-type document scanner system of the present invention with a document to be scanned disposed thereover.
Figure 2:
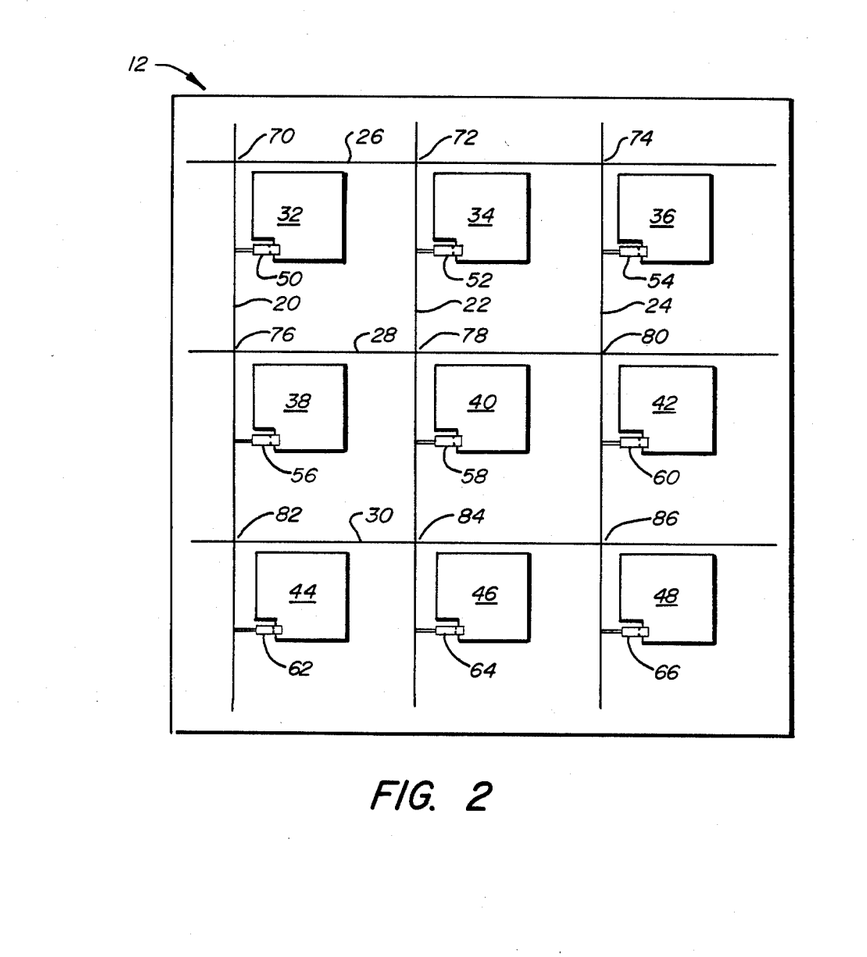
FIG. 2 is a top plan view of the contact-type scanner of FIG. 1 with the document removed.

FIGS. 1 and 2 illustrate a contact-type document scanner system, generally 10, and apparatus, generally 12, embodying the concepts disclosed by the present invention. The system 10 illustrated in FIG. 1 generally includes an apparatus 12 capable of providing electrical signals representative of an image carried by an image-bearing member such as a document 14 disposed thereover and a light source 16.

The apparatus 12 includes a transparent substrate 18, a first set of X address lines including address lines 20, 22 and 24, a second set of Y address lines including address lines 26, 28 and 30, and a plurality of light sensitive elements 32, 34, 36, 38, 40, 42, 44, 46 and 48. The apparatus 12 further includes an isolation device 50, 52, 54, 56, 58, 60, 62, 64 and 66 associated with each light sensitive element and a transparent, abrasion resistant cover layer 68.

As can be noted in FIG. 2, the X address lines 20, 22 and 24 and the Y address lines 26, 28, and 30 cross at an angle, and, as will become more apparent hereinafter, are spaced from one another to form a plurality of crossover points 70, 72, 74, 76, 78, 80, 82, 84 and 86. Associated with each of the crossover points is a respective one of the light sensitive elements. The light sensitive elements 32–48 are formed on the substrate 18 and are distributed thereover in spaced apart relation to form interstitial spaces 88 therebetween. The light sensitive elements 32–48 are further of the type which effect a detectable electrical characteristic in response to the receipt of light thereon. As will be more fully described hereinafter, the light sensitive elements 32–48 can comprise photovoltaic cells or photoresistors which effect a detectable change in electrical conductivity in response to the receipt of incident light thereon. The light sensitive elements are preferably formed from a deposited semiconductor alloy material, such as an amorphous semiconductor alloy material. Preferably, the amorphous semiconductor alloy material includes silicon and/or germanium and hydrogen and/or fluorine. Such alloys can be deposited by plasma-assisted chemical vapor deposition, i.e., glow discharge, as disclosed, for example, in U.S. Pat. No. 4,226,898 which issued on Oct. 7, 1980 in the names of Stanford R. Ovshinsky and Arun Madan for Amorphous Semiconductors Equivalent to Crystalline Semiconductors Produced By A Glow Discharge Process.

Each of the isolation devices 50–66 is associated with a respective one of the light sensitive elements 31–48. The isolation devices are also preferably formed from a deposited semiconductor alloy material, and most preferably, an amorphous semiconductor alloy material including silicon and/or germanium. The amorphous silicon and/or germanium alloy can also include hydrogen and/or fluorine and can be deposited by plasma-assisted chemical vapor deposition as disclosed in the aforementioned U.S. Pat. No. 4,226,898. As can be noted in FIG. 2, each of the isolation device 50-66 is preferably coupled in series relation with its associated light sensitive element 32-48 between respective pairs of the X address lines 20, 22 and 24 and the Y address lines 26, 28 and 30 (obviously, other known types of multiplexing schemes may also be employed without departing from the spirit or scope of the subject invention). As a result, the isolation devices 50-66 facilitate the selective addressing and detection of the electrical conductivity of each of the light sensitive elements by the application of read potentials to respective pairs of the X and Y address lines.

Referring now more particularly to FIG. 1, the light source 16 comprises a plurality of individual light sources 90, 92 and 94. Associated with each of the sources 90, 92 and 94 is a reflector 96, 98 and 100. The light sources 90, 92 and 94 and the reflectors 96, 98 and 100 are arranged to provide diffuse light as indicated by the arrows 102, which light is projected onto the apparatus 12 on the side of the substrate 18 opposite the light sensitive elements and the document 14 to be scanned. The document 14 is operatively disposed over the transparent cover layer 68 which includes a substantially planar document-receiving surface 104. The document 14 includes at least one image-bearing portion 106 of high optical density, hereinafter referred to as the dark image-bearing portion of the document, and at least one image-bearing portion 108 of low optical density, hereinafter referred to as the light image-bearing portion of the document. The cover layer 68 is preferably relatively thin so that the document 14 is closely spaced in juxtaposed relation to the light sensitive elements, such as, light sensitive elements 44, 46 and 48 illustrated in FIG. 1, for "proximity focusing" light from the image on document 14 onto associated ones of the light sensitive elements. The thickness of the cover layer 68 is chosen to provide a maximum usable signal consistent with a number of other variable parameters. These variable parameters include the angular distribution of the diffuse light intensity, the width of the light sensitive element and the spacing between adjacent ones of the light sensitive elements. While, in one embodiment, it is preferable that the thickness of the cover layer 68, the width of the light sensitive elements and the spacing between the light sensitive elements are all of a comparable dimension, in other preferred embodiments and depending upon the sensitivity of the light sensitive elements, the surface finish of the material from which image-bearing member is fabricated, the pressure with which the image-bearing member is urged against the cover layer and the strength of the light signal, it has been found that a wide range of relative dimensions may be employed. The key element which typifies this type of "proximity focusing" is a one-to-one relationship between the size of the small area portion of the image sensed by any given light sensitive element and the size of the element itself.

In one embodiment, the cover layer 68 may be affixed to the substrate 18 by a transparent adhesive 110. The adhesive 110 is preferably a material having an index of refraction which matches the index of refraction of the substrate 18 to that of the cover layer 68 so as to minimize the reflection from the surface boundaries bordered by the matching material.

In alternative embodiments, the cover layer 68 may be formed from a thin film of a transparent, abrasion-resistant material which is of less than 1 micron thickness, said film vacuum deposited directly atop the upper electrode of the light sensitive elements. In this embodiment, the cover layer 68 is formed of wide band gap silicon-nitrogen alloys, silicon oxygen alloys, or silicon carbon alloys. These materials are transparent, hard, abrasion-resistant coatings, the fabrication parameters of which in, for instance, glow discharge deposition systems are well known to routineers in the art.

In yet another, most preferred embodiment, the cover layer 68 may be formed from a relatively thin (5000 angstrom thick) film of diamond-like microcrystalline carbon which is prepared by the plasma glow discharge decomposition of a precursor carbon-containing gaseous reagent. Among some of the sources of carbon which may be employed in the practice of the instant invention are hydrocarbon gases such as methane, ethane, acetylene, and the vapors of organic liquids such as hexane and the like. Another group of carbon-containing compounds having utility are the halocarbons such as the various chlorine, fluorine, iodine and bromine compounds of carbon, which may or may not include hydrogen therein. Under the influence of an electrical field, a plasma may be developed from such a carbon containing gas. In the plasma, the precursor gases are decomposed and the carbon released, thereby depositing the carbon upon the upper electrode of the light sensitive elements in a generally tetrahedral configuration so as to form a hard, abrasion-resistant, transparent (approximately 4.5 eV band gap) diamond-like deposit.

The plasma may be created by subjecting a precursor gaseous atmosphere to a source of electrical energy such as energy generated by a microwave energy source, a radio frequency energy source, any other source of alternating current, or a DC source of energy. In addition to the carbon-containing species, the process gas may additionally include other components, such as hydrogen, halogens, or inert gases. These additional components are adapted to function to dilute the carbon-containing precursor gas so as to facilitate optimum conditions for the growth of diamond-like films; further the components may function as energy transfer agents to assist in the decomposition of the carbon-containing gas or they may function to accelerate the kinetics of the plasma reactions, for example by reacting with or otherwise scavenging various species in the plasma so as to shift equilibrium conditions and thereby favor the deposition of such high quality diamond-like carbon films.

In a typical deposition procedure: the array of light sensitive elements, with the upper electrodes already deposited thereupon, is operatively positioned in an evacuable deposition chamber. The chamber is sealed and pumped down to a background pressure which is typically less than $10^{-2}$ to $10^{-3}$ Torr. A process gas mixture of approximately 50-100 SCCM of methane and 100-500 SCCM of hydrogen is then introduced into the deposition chamber. The pumping speed is adjusted so as to maintain a total chamber pressure of approximately 0.1 Torr therein while the process gas flows therethrough. The substrate is heated to a temperature of approximately 200°-300° C. and microwave energy of about 2.45 GHz, at a total power level of approximately 75-175 watts, is introduced into the deposition chamber so as to create an excited plasma from the process gas therein. A bias of approximately +80 volts is established by disposing a charged wire in the plasma region. The current flow through the bias wire is approximately 175 milliamps. These deposition conditions are maintained for approximately 20 minutes, which conditions result in the deposition of a transparent, carbon-based layer of approximately 7,500 angstroms thickness (said layer exhibiting no significant carbon-hydrogen signature in the infrared absorption spectrum thereof).

Numerous variations of this process are within the spirit and scope of the subject invention. While it is possible to increase the amount of hydrogen in the precursor gaseous mixture, if the dilution increases too drastically, the deposition of microcrystalline-carbon decreases. In other words, a delicate balance of etch-deposition conditions must be maintained in order to deposit microcrystalline, vis-a-vis, amorphous carbon, diamond-like material. It should be specifically noted that inert gases such as argon, xenon and helium may be substituted for some or all of the hydrogen.

Figure 8:
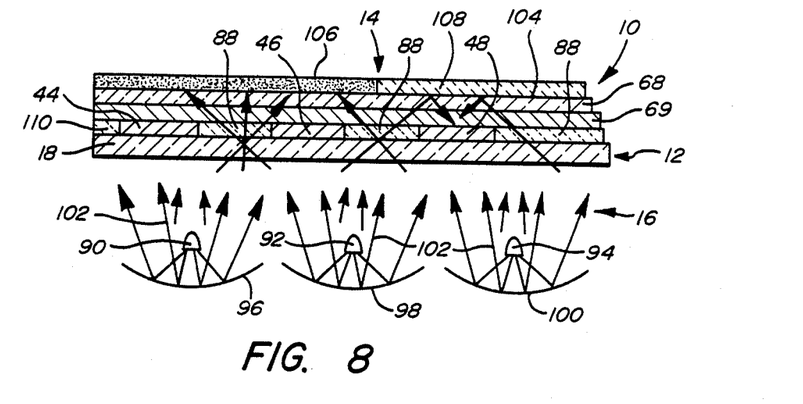
FIG. 8 is a partial side view, partly in cross section, of the scanner system of the present invention as illustrated in FIG. 1 with a static shielding layer added thereto.

Referring now to FIG. 8, the document scanning apparatus 12 of FIG. 1 is illustrated with the addition thereto of a static shielding layer generally referred to by the reference numeral 69. This shielding layer 69 was incorporated because the inventors discovered that a static electrical charge of up to 600 volts or more could build up on an image-bearing document 14 movably contacting the array of light sensitive elements. It is possible that such a large static charge could induce a charge of similar magnitude in the light sensitive elements disposed immediately therebelow, which induced charge is capable of destroying the diode characteristic of those elements. By vacuum depositing a thin film conductive layer, preferably formed of oxides of indium, tin, indium-tin, cadmium, zirconium or zinc between the light sensitive elements and the cover layer 69 applicants discovered that the static charge could be dissipated specifically, by connecting this shielding layer to ground potential (or to substantially the same potential as the light sensitive elements), the built-up static electrical charge on the image-bearing document 14 is unable to induce a similar charge in the light sensitive elements. As would be apparent to a routineer in the art, the thickness of the shielding layer 69 need only be sufficient to fully cover the surface of the light sensitive elements on which it is deposited, i.e., about 500-2500 angstroms. While the above referenced oxides constitute the preferred material from which to fabricate the shielding layer 69, other conductive, transparent coatings such as metals may be employed with equal advantage.

When the image-bearing document 14 is to be scanned, it is first placed over the apparatus 12 in substantial contact with the planar surface 104 of the transparent cover layer 68 or in contact with any other spacing or light collimating member so that the document is disposed in closely spaced juxtaposed relation to the light sensitive elements. Then, the light source 16 is energized for projecting the diffuse light 102 onto the back side of the apparatus 12 and then onto the surface of the document 14 adjacent the planar surface 104. In the dark portions 106 of the image on the document 14, the light will be substantially absorbed so that very little of the light impinging upon the dark portions 106 will be reflected back onto the associated light sensitive elements proximately disposed adjacent thereto, for example, light sensitive elements 44 and 46. However, the light striking the light portions 108 of the image on the document 14 will not be substantially absorbed and a substantially greater portion of the light impinging upon the light portions 108 will be reflected back onto the associated light sensitive elements proximately disposed adjacent thereto, such as light sensitive element 48. The light sensitive elements adjacent the light portions 108 of the document will thereby effect a detectable change in their electrical conductivity. When the light sensitive elements are formed from photovoltaic cells, they will not only effect a change in electrical conductivity, but they will also generate current. When the light sensitive elements are photoresistors, they will effect an increased electrical conductivity which can be detected by the application of read potentials to the respective pairs of the X address lines 20, 22 and 24, and the Y address lines 26, 28 and 30.

It is to be noted that the light has heretofore been described as initiating from behind the substrate and then being directed to reflect from the image-bearing document onto the light sensitive elements. However, the subject invention is not so limited. The light can also be initiated from behind the image-bearing document without departing from the spirit or scope of the subject invention.

Electrical signals representing a faithful reproduction of the image on the image-bearing document 14 can be obtained because the light sensitive elements 32-48 can be made very small. For example, the light sensitive elements can be fabricated to have dimensions of approximately 90 microns on a side. The isolating devices 50-66 can be formed to have a dimension of about 10-40 microns on a side and preferably 20 microns on a side. Also, the light sensitive elements 32-48 are preferably spaced apart so that they cover only a portion of the substrate 12 to permit the light to be projected onto the image-bearing document 14, whereby said document is scanned through the interstices which exist therebetween. For example, the light sensitive elements can be spaced so that they cover about 25-50% of the overall surface area of the substrate 18. Also, the light sensitive elements can be arranged in substantially coplanar relation so that each will be equally spaced in juxtaposed relation to the document to be scanned. Although FIG. 2 illustrates a 3×3 matrix of light sensitive elements, it can be appreciated that a much larger array of elements would be required in actual practice for scanning the entire surface area of an image-bearing document. Alternatively, the array of elements can be limited to a single elongated column or row; however, if the array is limited to a single 1×n or m×1 array of light sensitive elements, the array or the document must be movable relative to one another.

The electrical characteristic, and, in accordance with this preferred embodiment, the electrical conductivity of the light sensitive elements can be detected by applying read potentials to respective pairs of the X and Y address lines in series, and one at a time. However, and most preferably, the light sensitive elements can be divided into groups of elements with the read potentials applied to each group of elements in parallel to facilitate more rapid scanning of the document. Within each group of elements, the elements can be scanned in series.

Figure 3:
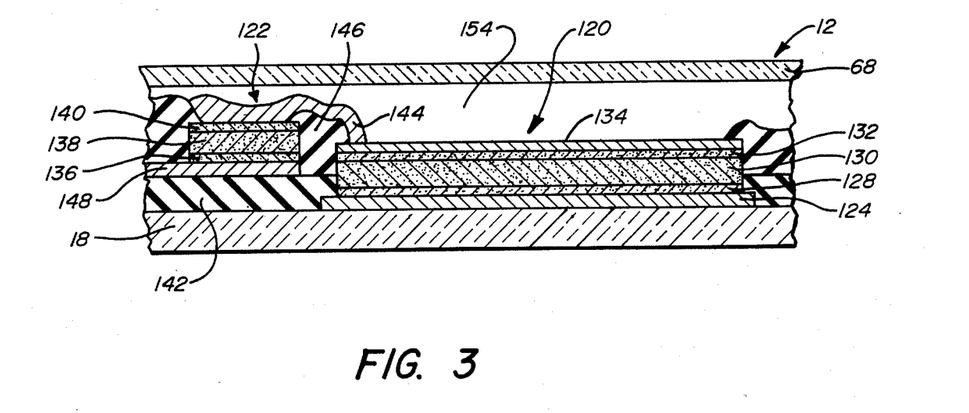
FIG. 3 is a partial cross-sectional side view illustrating a light sensitive element and an isolating device associated therewith embodying the present invention.
Figure 4:
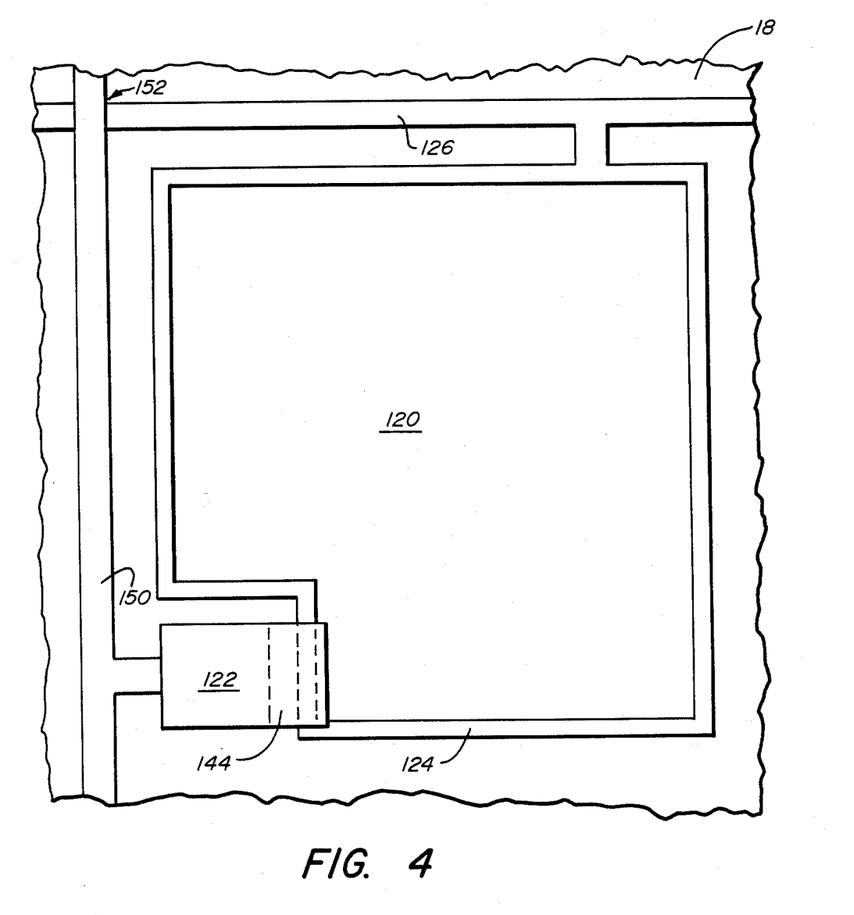
FIG. 4 is a top plan view of the light sensitive element and isolating device of FIG. 3.

Referring now to FIGS. 3 and 4, there is illustrated in greater detail a configuration of a light sensitive element 120 and an isolation device 122 structured in accordance with the principles of the present invention. Here, the apparatus 12 includes a transparent or glass substrate 18. Formed on the substrate 18 is a metal pad which is electrically connected to a Y address line 126. The metal pad 124 can be formed from, for example, aluminum, chromium, or molybdenum.

Formed on the metal pad 124 is the light sensitive element 120 which preferably takes the form of a photovoltaic cell. The photovoltaic cell or light sensitive element 120 can include an amorphous silicon or germanium alloy body fabricated by successively depositing a first doped region 128, an intrinsic region 130 and a second doped region 132. The regions 128 and 132 are preferably opposite in conductivity so that the region 128 is p-type and the region 132 is n-type. Overlying the n-type region 132 is a layer 134 of a transparent conductive oxide material such as indium tin oxide. Photovoltaic cells of this type are fully disclosed, for example, in the aforementioned U.S. Pat. No. 4,226,898 and therefore need not be described in detail herein.

The metal pad 124 not only forms an ohmic contact with the light sensitive element 120, but in addition, serves to block light from reaching the back side of the light sensitive element. This function of the metal pad 124 is particularly important when the scanning system is to be used in accordance with the embodiments illustrated in FIGS. 1 and 10.

The isolation device 122, fabricated in accordance with this embodiment, comprises a diode, also formed from an amorphous silicon or germanium alloy fabricated through the successive deposition of a p-type region 136, an intrinsic region 138 and an n-type region 140. The diode 122 is also formed on a metal pad 148 which is formed on a layer of a deposited insulating material 142 which can be fabricated from, for example, silicon oxide or silicon nitride. Since the diode 122 and the cell 120 include the same layer composition and structure, said isolation diode 122 can be formed during the same deposition operation as the photovoltaic cell 120.

The isolation diode 122 is coupled to the photovoltaic cell 120 by an interconnect lead 144. Separating the diode 122 from the photovoltaic cell 120 is a deposited insulator 146 which can also be formed from silicon oxide or silicon nitride.

The metal pad 148 is coupled to an X address line 150. As can be noted from FIG. 3, the X address line 150 and the Y address line 126 are spaced apart by the insulating layer 142. Because the address lines cross at an angle and are separated from one another, an insulated crossover point 152 is thereby formed.

The structure of FIG. 3 is completed by the superposed positioning of a transparent cover layer 68 (which can be formed from glass, plastic or the hard thin films described hereinabove) over the diode and the light sensitive element. When fabricated of thin films, said layer is vacuum deposited thereupon and when fabricated of glass or plastic, said layer is adhered thereto by a transparent adhesive which can fill the space 154. As previously mentioned, the transparent adhesive preferably has an index of refraction (1.45-1.57) which matches the index of refraction of the glass substrate 18 to that of the cover layer 68 so as to provide for the maximum transmission of light from the glass substrate through the layer.

Figure 5:
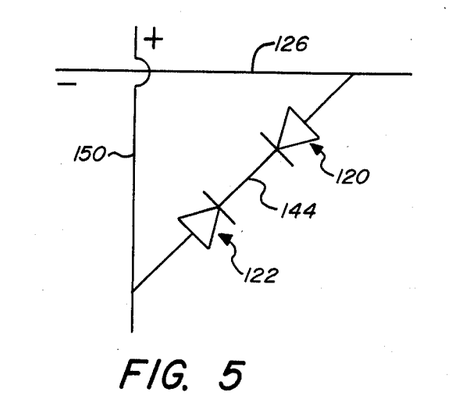
FIG. 5 is an equivalent circuit diagram of the light sensitive element and isolating device of FIG. 3.

Referring now to FIG. 5, there is illustrated the equivalent circuit diagram of the light sensitive element 120, the isolating diode 122 and the address lines 126 and 150 described with reference to FIG. 4. It can be noted that the interconnect lead 144 connects the cathodes of the photovoltaic cell 120 and the isolation diode 122 together. The anode of the diode 122 is coupled to the X address line 150 and the anode of the photovoltaic cell 120 is coupled to the Y address line 126.

In order to read the electrical characteristic of the photovoltaic cell 120, a positive potential is applied to the X address line 150 and a negative potential is applied to the Y address line 126. This forward biases the isolating diode 122. If light is being reflected off of a light small area portion of the image on the image-bearing document onto the associated small area photovoltaic cell 120, a photogenerated current will be produced within the cell 120, said current being detected through the forward biased diode 122. However, if the small area cell 120 is disposed adjacent to and therefore associated with one of the dark small area portions of the image-bearing document, substantially no light strikes the cell and hence substantially no photogenerated current will be produced by the cell 120. The difference between the two current levels can therefore be contrasted for deriving an electrical signal representative of the image adjacent the cell 120.

Figure 6:
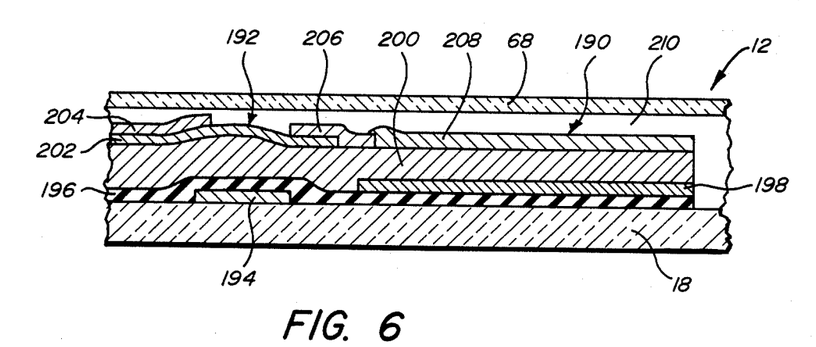
FIG. 6 is a partial cross-sectional side view of another light sensitive element and isolating device structured in accordance with a further embodiment of the present invention.

Referring now to FIG. 6, there is illustrated a further configuration of the light sensitive element 190 and the isolation device 192. Here, the light sensitive element 190 takes the form of a photoresistor and the isolating device 192 takes the form of a thin film field effect transistor. The apparatus 12 illustrated in FIG. 8 includes a transparent substrate 18, which can be formed from glass, for example. The gate 194 of the thin film field effect transistor 192 is first formed on the substrate 18. A layer of insulating material 196 is then deposited over the gate 194 and the substrate 18. A metallic pad 198 is then formed over the insulator 196 to define one contact of the light sensitive element or photoresistor 190.

A substantially intrinsic amorphous silicon alloy layer 200 is then deposited as shown for forming the semiconductor body of the thin film field effect transistor 192 and the semiconductor body of the photoresistor 190. A layer 202 of n-type amorphous silicon alloy can then be deposited over the intrinsic amorphous silicon alloy 200 to enhance the ohmic contact between the source and drain electrodes 204 and 206 with the amorphous silicon alloy 200. A layer of a transparent conductor 208 can be formed over the amorphous silicon alloy 200 in contact with the transistor electrode 26 and in a corresponding configuration to the metal pad 198 to define the top contact of the photoresistor 190. The structure of FIG. 6 is completed with the transparent cover layer 68, which can be formed from glass or one of the other hard, transparent coatings detailed hereinabove. Of course, a transparent adhesive, if necessary, is adapted to fill the space 210 as previously described.

Figure 7:
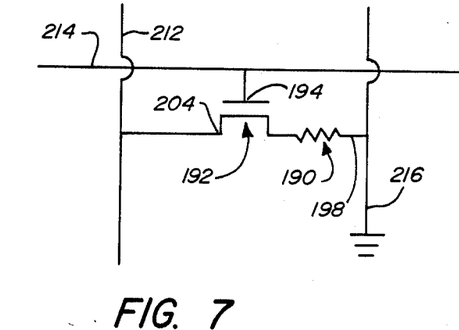
FIG. 7 is the equivalent circuit diagram of the light sensitive element and isolating device of FIG. 6.

As will be noted in FIG. 6, the gate 194, the electrode 204, and the bottom contact 198 of the photoresistor 190 are all vertically separated from one another. As a result, each of these elements can be connected to respective address lines while being insulated from one another. FIG. 7 shows the equivalent circuit diagram of the structure illustrated and described with reference to FIG. 6.

In FIG. 7, it can be noted that the electrode 204 of the thin film field effect transistor 192 is coupled to an X address line 212. The gate 194 of the transistor 192 is coupled to a Y address line 214. The bottom contact 198 of the photoresistor 190 is coupled to a common potential such as ground by a lead 216. As a result, the electrical conductivity of the photoresistor 190 can be sensed by the application of suitable potentials to the electrode 204 and gate 194 for turning the transistor 192 on. If light is being reflected off of a light portion of the image on an image-bearing document onto the photoresistor 190, current flows between the transistor electrodes 204 and 206, which current can be sensed on the X address lead 212. However, if the photoresistor 190 is operatively disposed immediately adjacent a dark portion of the image on the image-bearing document, very little light will be projected onto the photoresistor 190 so that substantially no current flows from the electrode 204 to the electrode 206. In this manner, the condition of the photoresistor 190 can be detected.

In accordance with the present invention, it is further contemplated that electrical signals can be provided which represent the color hues of an image. For example, each of the light sources 96, 98 and 100 of FIG. 1 can include three separate light sources, each being arranged to emit light of each different primary color, i.e., red, green, and blue. To generate the electrical signals representative of the color hues of the image, the image-bearing member 14 can be sequentially exposed to the red, green and blue light. During each exposure, the associated light sensitive elements can be addressed. For example, when the document 14 is exposed to the red light, those small area image portions thereof which include a red color component will reflect red light onto the associated light sensitive elements disposed adjacent thereto. These elements will effect a greater change in electrical conductivity than those elements adjacent image portions which do not include a red color component. After this procedure is performed for each of the red, green and blue primary colors, the three electrical signals provided from each light sensitive element can be combined to derive both the intensity and color hue of the image.

Referring now to FIG. 9 there is illustrated, in perspective view, the image scanning array of light sensitive elements 10 as operatively employed in an image scanner, generally referred to hereinafter by the reference numeral 250. While the image scanner 250 is depicted as being generally rectangularly shaped, it is to be appreciated by those of ordinary skill in the art that the shape of the scanner 250 is not so limited and any aesthetically pleasing shape or configuration which is capable of receiving and feeding an image-bearing document such as 14 therethrough is well within the spirit and scope of the subject invention. It should also be appreciated that while the image scanner 250 depicted in FIG. 9 is generally horizontally oriented, the scanner 250 could also be deployed in a generally vertical orientation to facilitate the hanging of said scanner from a wall or other supporting surface.

Figure 10:
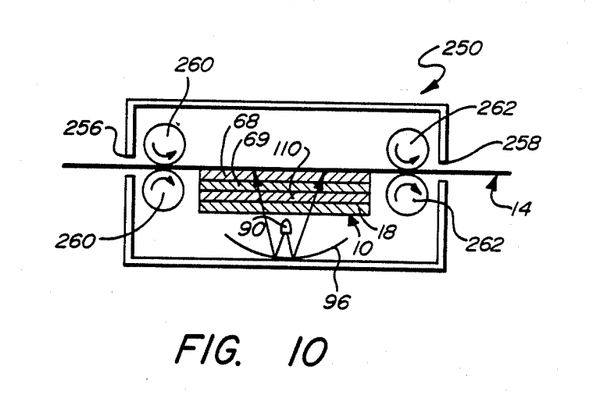
FIG. 10 is a cross-sectional side view taken along line 10—10 of FIG. 9 illustrating one embodiment of the contact scanning apparatus by which the image-bearing document may be moved past the photosensor array.
Figure 11:
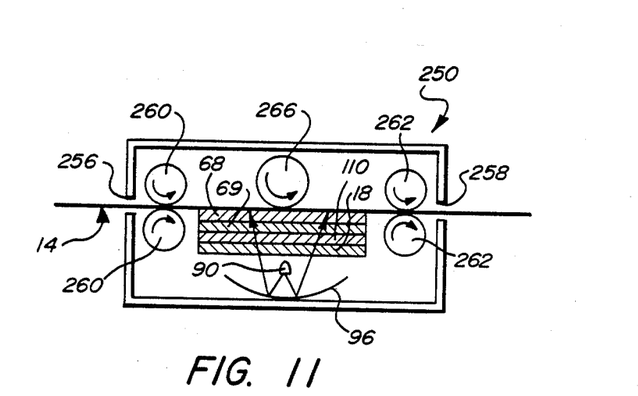
FIG. 11 is a cross-sectional side view also taken along line 10—10 of FIG. 9 illustrating a second embodiment of the contact scanning apparatus by which the image-bearing document may be moved past the photosensor array.

As illustrated in FIG. 9, the image scanner 250 is formed from an upper elongated generally rectangularly shaped encasement 252 and a lower, generally rectangularly shaped encasement 254. The encasements are similarly dimensioned with hollow interiors so as to combine to form a document introduction slot 256 on one side thereof (as best seen in FIGS. 10 and 11) and a document exit slot 258 on the opposite said thereof (as can be seen in FIGS. 9–11). The length dimension of the image scanner 250, the height dimension thereof and the width dimension thereof are selected so as to provide said scanner with the capability of generating electrical signals indicative of the image or other surface condition of a member such as the image-bearing document 14 which can be fed therethrough. Accordingly, one preferred length dimension of the image scanner 250 is selected to be at least 8 inches so as to accomodate conventional letterhead. Of course, if the scanner is to be used for duplicating blueprints, a much larger sized opening must be provided. The interior volumetric capacity of the scanner 250 must also be selected so as to house therewithin the array of light sensitive elements 10 described and illustrated hereinabove as well as any paper feed mechanisms, light sources and electronics which are required for the electronic imaging processing.

There is positioned interiorly of said image scanner 250 an elongated, preferably linear array of light sensitive elements, generally 10. The length of the array of light sensitive elements 10 is at least equal to the transverse dimension of the image-bearing document 14 being fed through the slots 256 and 258 of the said scanner. There is also housed beneath the array of light sensitive elements 10, one elongated or a plurality of localized light sources 90 which are adapted to reflect preselected wavelengths of light off an associated reflector 96 from which said preselected wavelengths of light are directed so as to impinge upon small area portions of said image-bearing document 14 and be reflected therefrom onto associated small area light sensitive elements. The cooperative operation of the light sources 90 and the array of light sensitive elements 10 is identical to the operations described hereinabove with respect to FIGS. 1 and 8 and need not be repeated.

It is important to note however, that the image-bearing document 14 must be into close proximity to the juxtaposed array of small area light sensitive elements 10 so as to generate the electronic signals indicative of the image on said small area portions of the image-bearing member in a "proximity focusing" manner. In order to accomplish such focusing, the image-bearing document 14 is introduced into the image scanner 250 through the introductory slot 256 after which the opposed surfaces of said document 14 are engaged by a pair of vertically spaced and oppositely directed contact rollers 260. The contact rollers 260 are rotated by an electric stepper motor (not shown) so as to move said image-bearing document 14 past said array of light sensitive elements 10 in such a manner that the image-bearing surface of said document 14 is brought into sliding contact with the transparent abrasion resistance layer 68 of said array 10. Tension is maintained on the image-bearing document 14 by a pair of vertically spaced, oppositely directed contact rollers 262, which rollers are positioned at the downstream end of the image scanner 250 so as to contact the opposite surfaces of the image-bearing document 14 and thereby direct said image-bearing document 14 through the exit slot 258 thereof. As said image-bearing document 14 moves past the array of light sensitive elements 10 in a proximity focusing manner, the image thereon or surface condition thereof is electronically generated and the electronic signals corresponding to said image are transferred via output lines 262 to downstream processing equipment, such as a memory buffer, a computer, display apparatus, data processing apparatus, etc. Alternatively, the series of buttons 264 located at the left-hand corner of the scanner 250 can be used as a modem to transmit the electronic signals generated by the array of light sensitive elements 10 to remote telecommunication systems. Note that a power toggle switch 266 is also provided at the left-hand corner so as to switch the scanner 250 into an active or inactive mode of operation.

Referring now specifically to FIG. 11, there is illustrated a second embodiment of the transport mechanism provided interiorly of the image scanner 250 of the subject invention. In this embodiment not only are said input contact rollers 260 provided adjacent the introductory slot 256 and exit contact rollers 262 provided adjacent the exit slot 258 of the scanner 250, but an elongated, counterclockwise directed, contact roller 266 is provided immediately above the array of light sensitive elements 10 so as to urge the image-bearing document 14 into proximity focusing contact with the transparent, abrasion resistance layer 68 deposited atop said array of light sensitive elements 10. This is a fail-safe measure which ensures that the image-bearing document 14 is sufficiently proximate the light sensitive array 10 maintained in a substantially planar configuration while passing therepast. Note that the array further includes the static sheilding layer 69 for preventing the relative contacting motion between the abrasion resistance layer 68 and the image-bearing document from inducing a static electrical charge which would harm the light sensitive elements.

It is also to be noted that the document contacting rollers 260, 262 and 266 may either be foreshortened and spacedly positioned along the width of the surface of the image-bearing document 14 passing through the image scanner 250 or said rollers can be elongated rollers covering the entire surface of said document. It is further to be noted that the contact rollers may be somewhat wedge-shaped so as to further urge the image-bearing document 14 in an outward direction whereby the document is maintained in a generally planar configuration. Other such transport schemes are considered within the purview of the ordinarily skilled artisan and as such are within the scope of the present invention.

Finally, the image scanner 250 is also depicted as being equipped with a speaker (as at 268) so that the scanner 250 is provided with the capability of transmitting data from the image-bearing document 14 to downstream processing apparatus, as previously described, which data is then processed and retransmitted to said scanner 250 for audio playback. In this manner, the image scanner 250 is adapted for reading to the visually impaired.

From the foregoing, it should now be appreciated that the present invention provides a new and improved apparatus for providing electrical signals representative of an image projected thereupon. As should also be appreciated from the foregoing, the light sensitive elements can be formed from photovoltaic cells or photoresistors which exhibit a detectable change in an electrical characteristic such as electrical conductivity upon receipt of incident light. The isolating devices can take the form of diodes or thin film field effect transistors, for example, and any combination of such light sensitive elements and isolating devices are possible.

The apparatus of the present invention exhibits distinct advantages over similar apparatus of the prior art. Also, the image-bearing document can be electrically read at a faster rate than that possible with prior art scanners, especially when the light sensitive elements are read in parallel. Also, the document scanners of the present invention can be made substantially smaller and lighter to enhance the portability thereof. Further, static charges will not build up on the document-receiving surfaces of the apparatus and said transparent, document-receiving surface can be fabricated so as to be extremely hard and abrasion resistant, thereby increasing the lifetime of the apparatus.

While for purposes of illustration and explantion, several forms of this invention have been disclosed, other forms thereof may become apparent to those skilled in the art upon reference to this disclosure and, therefore, this invention is to be limited only by the scope of the appended claims.

We claim:

1. Apparatus capable of providing electrical signals representative of an image on a moving image-bearing member, said apparatus including a photosensitive array of deposited semiconductor light sensitive elements, each of said elements being non-light transmissive, non-apertured, continuous and adapted to receive light from a corresponding small area portion of an image-bearing member and generate a detectable signal representative of the intensity of received light; the improvement comprising, in combination:

said array including at least one column of light sensitive elements operatively disposed so as to cover at least a portion of at least one dimension of an image-bearing member;

spacing means for closely positioning said light sensitive elements in juxtaposed relation relative to an image-bearing member so as to proximity focus light onto said light sensitive elements from corresponding small area portions of said member; and means for moving an image-bearing member past said light sensitive elements.

2. Apparatus as in claim 1 wherein said spacing means includes a cover layer overlying said light sensitive elements; said cover layer formed of a transparent abrasion-resistant material selected from the group consisting essentially of a silicon-carbon alloy, a silicon-nitride alloy, a silicon-oxygen alloy or microcrystalline carbon.

3. Apparatus as in claim 2 further including shielding means operatively disposed between the upper electrode of said light sensitive elements and said cover layer, said shielding means adapted to prevent the build-up of a large static charge.

4. Apparatus as in claim 3 wherein said shielding means is fabricated from a material selected from the group consisting essentially of an oxide of indium, tin, zinc, zirconium, cadmium, or mixtures thereof.

5. Apparatus as in claim 3 wherein said shielding means is fabricated from a material selected from the group consisting essentially of gold, silver, aluminum, copper or other highly conductive metal.

6. Apparatus as in claim 3 wherein said shielding means is electrically connected to ground potential.

7. Apparatus as in claim 1 wherein the light sensitive elements are fabricated from a thin film semiconductor alloy material selected from the group consisting essentially of a silicon alloy, a germanium alloy, or combinations thereof.

8. Apparatus as in claim 1 wherein said light sensitive elements comprise P-I-N photovoltaic cells.

9. Apparatus as in claim 1 wherein said light sensitive elements comprise P-I-N photoresistors.

10. Apparatus as in claim 1 further including isolation means associated with each of said light sensitive elements for facilitating the selective addressing of said elements.

11. Apparatus as in claim 10 wherein each isolation means is a diode.

12. Apparatus as in claim 10 wherein each isolation means is a thin film transistor.

13. Apparatus as in claim 1 wherein said light sensitive elements are disposed in a substantially common plane.

14. Apparatus as in claim 1 further including means for projecting light onto said image-bearing member.

15. Apparatus as in claim 14 wherein said light means is adapted to sequentially project light of different colors onto said image-bearing member.

16. Apparatus as in claim 10 wherein each isolation means is a diode; and each of said light sensitive elements and the associated isolation diode includes a semiconductor body formed of stacked thin film layers including a first doped layer of a first conductivity type, a substantially intrinsic layer, and a second doped layer of a conductivity type opposite to that of said first doped layer.

17. Apparatus as in claim 16 further comprising a substrate over which said light sensitive elements and said isolation diodes are formed and wherein the order of said stacked thin film layers from which the semiconductor body of each light sensitive element and isolation diode is fabricated is the same.

18. Apparatus as in claim 17 wherein each of the light sensitive elements further includes first and second electrodes.

19. Apparatus as in claim 18 wherein the first electrodes of said light sensitive elements are each formed upon said substrate as a distinct, substantially opaque, thin film, conductive pad and the semiconductor bodies of each light sensitive element and the associated isolation diode thereof are formed upon and electrically interconnected by said opaque conductive pad.

20. Apparatus as in claim 19 wherein said substrate is transparent and the opaque conductive pads of said light sensitive elements are spacedly disposed so that light passes through said substrate and between and around said conductive pads to illuminate said image-bearing member.

21. Apparatus as in claim 1 wherein said moving means includes means for engaging said image-bearing member and transporting said image-bearing memeber into proximity focusing relationship with said array of light sensitive elements.

22. Apparatus as in claim 21 wherein said array is a 2-dimensional matrix of elements and said engaging means translationally transports said image-bearing member into position for the 2-dimensional scanning thereof.

23. Apparatus as in claim 21 wherein said array is a 1-dimensional matrix of elements and said engaging means continuously and translationally transports said image-bearing member past said array for the line-by-line scanning thereof.

24. Apparatus as in claim 21 wherein said engaging means includes roller means for frictionally engaging a surface of said image-bearing member.

25. Apparatus as in claim 24 wherein the roller means includes a plurality of rollers for transporting said image-bearing member from a document-entry slot to a document-exit slot.

26. Apparatus as in claim 25 wherein at least one of said rollers are tapered to maintain at least a portion of said image-bearing member moving past the array in a generally planar attitude.

27. Apparatus as in claim 25 wherein one of said rollers is operatively disposed so as to bring at least the portion of the image-bearing member moving past the array into intimate contact with said spacing means.

28. Apparatus as in claim 21 wherein said moving means further includes motor means for transporting said image-bearing member past said array.

29. Apparatus as in claim 28 further including means for governing the speed of movement of said image-bearing member.

30. Apparatus as in claim 21 wherein said moving means comprises belt means for frictionally engaging a surface of the image-bearing member and transporting said member into said proximity focusing relationship with juxtaposed light sensitive elements.

31. Apparatus as in claim 1 further including downstream processing means to which the electrical signals generated by said light sensitive elements are transmitted.

32. Apparatus as in claim 31 wherein the processing means are slected from the group consisting essentially of: a memory buffer, a display, a computer terminal, a monitor, a CAD-CAM system, or combinations thereof.

* * * * *